United States Patent [19]

Planer et al.

[11] 4,443,719

[45] Apr. 17, 1984

[54] VOLTAGE ISOLATED GATE DRIVE CIRCUIT

[75] Inventors: Norman G. Planer, Annandale; Zoltan Zansky, Roseville, both of Minn.

[73] Assignee: Honeywell Inc., Minneapolis, Minn.

[21] Appl. No.: 387,403

[22] Filed: Jun. 11, 1982

[51] Int. Cl.³ .................. H03K 17/10; H03K 17/687
[52] U.S. Cl. .................. 307/570; 307/270; 307/412; 307/577; 363/60
[58] Field of Search ............. 307/353, 566, 570, 246, 307/577, 264, 270, 268, 285, 584, 318, 412; 363/60

[56] References Cited

U.S. PATENT DOCUMENTS

| | | | |
|---|---|---|---|
| 3,760,198 | 9/1973 | Mori et al. ............... | 307/268 |
| 3,895,238 | 7/1975 | Saari ...................... | 307/270 X |
| 4,032,838 | 6/1977 | Minami et al. ........... | 307/570 X |
| 4,053,799 | 10/1977 | Minami ................... | 307/353 X |
| 4,095,163 | 6/1978 | Montague ................ | 307/318 X |
| 4,266,149 | 5/1981 | Yoshida .................. | 307/270 X |
| 4,311,930 | 1/1982 | Chan et al. .............. | 307/575 |
| 4,360,744 | 11/1982 | Taylor .................... | 307/570 X |

FOREIGN PATENT DOCUMENTS 54-158849 12/1979 Japan .................... 307/270

Primary Examiner—Larry N. Anagnos
Assistant Examiner—David R. Hudspeth
Attorney, Agent, or Firm—Alfred N. Feldman

[57] ABSTRACT

A voltage isolated gate drive circuit for insulated gate semiconductors utilizes a small, inexpensive pulse transformer to provide a rectangular drive wave form. The small pulse transformer can be operated with an input square wave form at relatively low frequencies, such as 60 hertz, and can be operated from a common power supply with the high voltage supplied to the output field effect transistor.

9 Claims, 2 Drawing Figures

VOLTAGE ISOLATED GATE DRIVE CIRCUIT

BACKGROUND AND SUMMARY OF THE INVENTION

Drive circuits for high voltage solid state switches are well known. Typically this type of circuitry requires separate power sources and is normally accomplished by opto-isolators or transformers to couple a driving signal from a signal source to the gating electrode of a solid state switch. These and other types of drive circuits for high voltage applications typically require rather large isolating transformers and are therefore space consuming and costly in nature.

It is desirable to provide a low cost, small, isolated arrangement for driving the gate circuit of high voltage semiconductor devices such as metal oxide field effect transistors. These field effect transistors have come into wide usage and it is desirable to drive line voltage units from a relatively low voltage control or drive circuit. The present invention accomplishes this purpose by the use of a very small pulse type transformer and is capable of being operated with very low frequency rectangular switching voltage wave forms. This is accomplished by providing some means to differentiate the leading and falling edges of the input or signal voltage. This differentiated signal is then fed into the primary of a step-up type of pulse transformer. The voltages are stepped up substantially, and are provided as a series of sharp driving pulses to a bidirectional voltage breakdown means made up of a pair of series connected zener diodes that are arranged in a back-to-back configuration to drive the gate of a field effect transistor. The field effect transistor has a source-drain circuit connected to a high voltage source and can be driven with the present arrangement from the relatively low voltage, and low frequency rectangular wave signal voltage. This is accomplished by breaking down the zener diodes to charge a capacitor (which might be the input capacitance of the field effect transistor). The driving signal first charges the capacitor to operate the field effect transistor in one mode, and then allows for the discharge of the capacitor on the reverse half cycle of the applied signal to discharge the capacitor and operate the field effect transistor in the second mode of operation.

The present invention requires only a very small, low cost pulse transformer which will store and transmit a pulse of only a few microseconds in width. This eliminates the prior art arrangements wherein the gate drive circuits did not use zener diodes and required large, wide-band pulse transformers for voltage isolation.

DESCRIPTION OF THE PREFERRED EMBODIMENT

Figure 1:
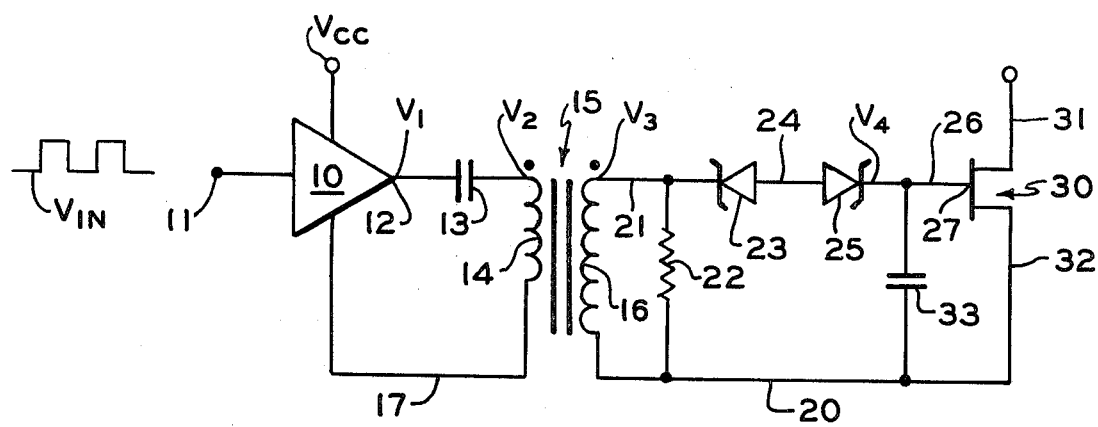
FIG. 1 is a schematic diagram of the high voltage isolated gate drive circuit.

The circuit of FIG. 1 is provided with a signal voltage $V_{IN}$. The voltage $V_{IN}$ is provided to an amplifier 10 that is energized from a voltage source $V_{cc}$ with the amplifier having an input means shown at 11. An output means 12 of the amplifier 10 is connected to a capacitor 13 which in turn is connected to a primary winding 14 of a pulse transformer generally disclosed at 15 and which has a secondary winding 16. A conductor 17 is common to both the input 11 and the output 12 of the amplifier 10. The amplifier 10 further is connected by the conductor 17 to the opposite side of the primary winding 14 so that the output of the amplifier 10 is coupled through the capacitor 13 to the primary winding 14 of the transformer 15. The input voltage to the primary winding 14 has been designated as $V_2$ while the output at 12 from amplifier 10 has been designated as $V_1$. The transformer means 15 has a turns ratio to step up the voltage between the primary winding 14 and the secondary winding 16 and the turns ratio can be any convenient turns ratio that will be designated as N.

The secondary winding 16 has a common output conductor 20 and a further output conductor 21 across which is connected a resistor 22. The resistor 22 can be any form of impedance that is selected to damp the ringing effect that pulses passing through the transformer 15 would cause. The output voltage on conductor 21 from the secondary winding 16 will be designated as voltage $V_3$. The conductor 21 is connected to a zener diode 23 which is connected by a conductor 24 to a second zener diode 25 which in turn is connected by a conductor 26 to a gate 27 of a metal oxide semiconductor field effect transistor 30. The field effect transistor 30 has a drain-source means which connects between an input conductor 31 and an output conductor 32 that is common to the conductor 20. The voltage at the conductor 26 or the gate 27 of the field effect transistor 30 has been designated as $V_4$. The electric circuit is completed by providing a capacitor 33 that is connected between the gate 27 of the field effect transistor 30 and the source of the field effect transistor at the conductor 32.

OPERATION

Figure 2:
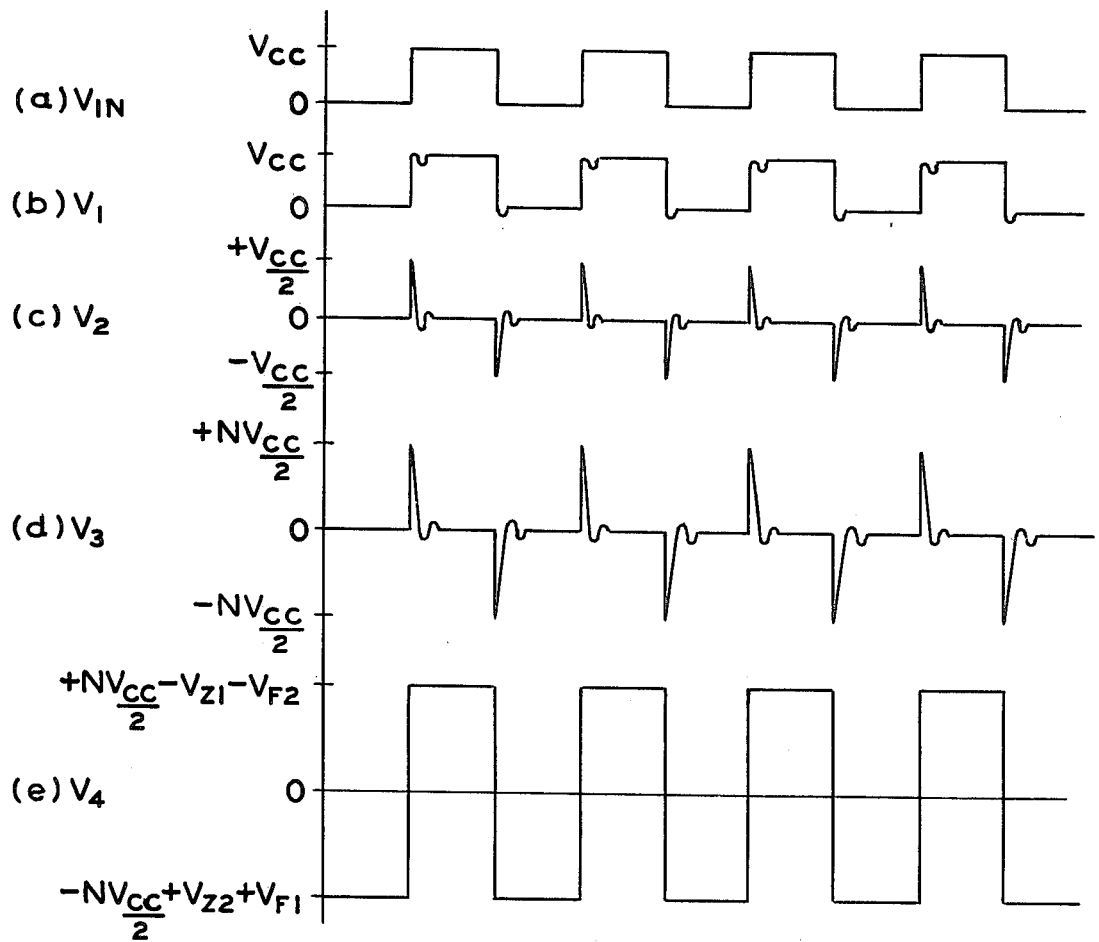
FIG. 2 is a series of wave forms showing the operation of the circuit of FIG. 1.

In the present invention a method of utilizing a very small, inexpensive pulse transformer 15 to achieve a voltage isolated rectangular gate-to-source wave form to drive a high voltage, high power metal oxide semiconductor field effect transistor 30 at a low switching frequency (such as a 60 hertz frequency or less) is disclosed. The circuit of FIG. 1 shows the circuit implementation of the invention. FIG. 2 shows the voltage wage forms at each node in the circuit of FIG. 1. The input voltage is a rectangular wave form such as $V_{IN}$ and is disclosed at FIG. 2(a) where the voltage is driven from a zero level to the voltage $V_{cc}$. The amplifier 10 has an output voltage $V_1$ as shown in FIG. 2(b) that is driven also from zero to $V_{cc}$. The amplifier 10 and the capacitor 13 taken together from a differentiator means and provide a voltage $V_2$ as shown at FIG. 2(c). The differentiator wave form $V_2$ of FIG. 2(c) is a series of narrow pulses at the rising and falling edges of the wave form $V_1$ of FIG. 2(b).

The transformer 15 provides an increased version of the wave form of FIG. 2(c) and is produced as voltage $V_3$ in the secondary winding 16 of the circuit. It will be noted in FIG. 2(d) that the voltage of the wave form provided at $V_3$ is of the magnitude of N times $V_{cc}/2$ thereby showing that the wave form has been amplified by the turns ratio of the transformer 15.

The positive going pulse of $V_3$ breaks down the zener diode 23 and will charge the capacitor 33 to the peak value of the pulse minus the zener breakdown voltage of the zener 23 ($V_{Z1}$) minus the forward voltage drop of the zener 25 ($V_{F2}$) or to the zener voltage of the zener 25 ($V_{Z2}$) plus the forward voltage drop of the zener 23 ($V_{F1}$), whichever is less. The zener diode 25 will prevent the capacitor 33 from discharging. (Actually, the capacitor 33 will discharge with a time constant $R_{Z2} C_2$ where $R_{Z2}$ is the reverse leakage resistance of the zener diode 25.) This will produce the positive going portion of the output wave form, $V_4$ as shown in FIG. 2(e). The negative going pulse of the secondary voltage $V_3$ will break over the zener diode 25 and allow the capacitor 33 to rapidly discharge to zero and then charge to the negative value of $(-N \; V_{cc}/2 + V_{Z2} + V_{F1})$ or $-(V_{Z1} + V_{F2})$, whichever is the least negative. The discharge will be prevented by the back bias of the diode 23 until the positive going pulse occurs again. In this way rectangular wave forms of arbitrary positive and negative amplitudes can be supplied by proper selection of the transformer turns ratio, and, and the zener diode breakdown voltages, $V_{Z1}$ and $V_{Z2}$. If very low leakage zener diodes are used, the capacitor 33 can be eliminated and the input capacitance of the metal oxide semiconductor field effect transistor 30 will be large enough to maintain the rectangular wave form. The resistor 22 is chosen to damp the ringing of the pulses in the transformer 15.

With the presently disclosed circuit it is possible to take a relatively low frequency, low voltage rectangular wave form and use it as the gating signal for a high potential gated semiconductor device such as a metal oxide semiconductor field effect transistor. Since the breakdown function of the zener diodes can be replaced with other types of bidirectional voltage breakdown means (such as a Diac), since the resistor 22 is optional dependent on the operating circumstances, and since the capacitor 33 might be replaced by the input capacitance of the semiconductor switch itself, it is obvious that circuit variations from that shown in FIG. 1 are readily available. Also, the input circuitry made up of the amplifier 10 and the capacitor 13 could be readily replaced by any type of differentiator means and that circuitry has been shown by way of example only. As such, the applicants wish to be limited in the scope of their invention solely by the scope of the appended claims.

The embodiments of the invention in which an exclusive property or right is claimed are defined as follows:

1. An isolated drive circuit for a high voltage semiconductor device at relatively low switching frequency, including: transformer means including a primary winding and a secondary winding with said primary winding connected to input means; said input means including differentiator means driven by a signal voltage; a field effect transistor including a gate electrode and source-drain means connected to a high voltage source; and said secondary winding connected to said gate through bidirectional voltage breakdown means, and to said source-drain means to control conduction of current through said source-drain means from said high voltage source; said signal voltage and said high voltage source being isolated from each other by said transformer means to allow said field effect transistor to be controlled by said signal voltage which is small in comparison to the magnitude of said high voltage source.

2. An isolated drive circuit as described in claim 1 wherein said field effect transistor is a metal oxide semiconductor field effect transistor, and said gate and said drain-source means of said field effect transistor are connected by a capacitor.

3. An isolated drive circuit as described in claim 2 wherein said bidirectional voltage breakdown means including a pair of zener diodes connected in series in a back-to-back relationship.

4. An isolated drive circuit as described in claim 3 wherein said transformer secondary winding includes a parallel-connected resistor selected in magnitude to damp the ringing effect of pulses in said transformer means.

5. An isolated drive circuit as described in claim 4 wherein said differentiator means includes an amplifier and a coupling capacitor between an input to said differentiator means and said transformer primary with said amplifier energized from a relatively low voltage compared to said high voltage source.

6. An isolated drive circuit as described in claim 5 wherein said signal voltage is a square wave voltage.

7. An isolated drive circuit as described in claim 1 wherein said transformer secondary is paralleled by an impedance means to damp the ringing effect of pulses in said transformer means.

8. An isolated drive circuit as described in claim 7 wherein said impedance means is a resistor.

9. An isolated drive circuit as described in claim 1 wherein said voltage breakdown means is a pair of zener diodes connected in series in a back-to-back relationship.

* * * * *